(12) United States Patent
Chang et al.

(10) Patent No.: US 8,666,720 B2
(45) Date of Patent: Mar. 4, 2014

(54) SOFTWARE EXTENSIONS TO A HIGH LEVEL DESCRIPTION LANGUAGE SIMULATOR TO PROVIDE INFRASTRUCTURE FOR ANALOG, MIXED-SIGNAL, RF MODELING AND VERIFICATION

(76) Inventors: Henry Chung-herng Chang, Cupertino, CA (US); Kenneth Scott Kundert, Mountain View, CA (US)

(*) Notice: Subject to any disclaimer, the term of this patent is extended or adjusted under 35 U.S.C. 154(b) by 500 days.

(21) Appl. No.: 12/848,990

(22) Filed: Aug. 2, 2010

(65) Prior Publication Data

US 2011/0153305 A1 Jun. 23, 2011

Related U.S. Application Data

(60) Provisional application No. 61/231,281, filed on Aug. 4, 2009.

(51) Int. Cl.
*G06F 17/50* (2006.01)
(52) U.S. Cl.
USPC ............. 703/13; 703/17; 703/19; 716/106; 717/121; 712/38
(58) Field of Classification Search
USPC .......... 703/13, 17; 712/38; 716/106; 717/121
See application file for complete search history.

(56) References Cited

U.S. PATENT DOCUMENTS

| | | | | |
|---|---|---|---|---|
| 4,872,126 A | * | 10/1989 | Premerlani et al. | 716/106 |
| 5,499,192 A | * | 3/1996 | Knapp et al. | 716/102 |
| 5,555,434 A | * | 9/1996 | Carlstedt | 712/38 |
| 7,251,795 B2 | | 7/2007 | Biswas et al. | |
| 7,260,792 B2 | | 8/2007 | Chetput et al. | |
| 7,424,416 B1 | * | 9/2008 | Cavanagh et al. | 703/13 |
| 7,721,090 B1 | * | 5/2010 | Deepak et al. | 713/165 |
| 7,805,706 B1 | * | 9/2010 | Ly et al. | 717/121 |
| 7,877,248 B1 | * | 1/2011 | Clune | 703/13 |
| 8,478,576 B1 | * | 7/2013 | Cameron | 703/14 |
| 2002/0049576 A1 | | 4/2002 | Meyer | |

OTHER PUBLICATIONS

Sheffler, "Functional Verification in the Presence of Linear Analog Circuits," Design and Verification Conference, 2008.
Sheffler, "Design of a Switch-Level Analog Model for Verilog," IEEE International Behavioral Modeling and Simulation Conference, 2008.
Jones, et al., "Sending Analog Values Along Digital Wires," Design and Verification Conference, 2007.

* cited by examiner

*Primary Examiner* — Thai Phan

(57) ABSTRACT

An extension to a simulator (801) that allows the user to specify real numbers, voltages, and currents (808) on ports of an electrical net is presented. The computer using the analog wire functionality routines (805), the routines for determining nets (804), the net manager (803), and the pin manager (802) resolves unspecified values on said electrical nets. The user may specify at least one value on said port and may specify whether said port is driven. The extension includes additional math functions (1901).

20 Claims, 18 Drawing Sheets

Figure 1:
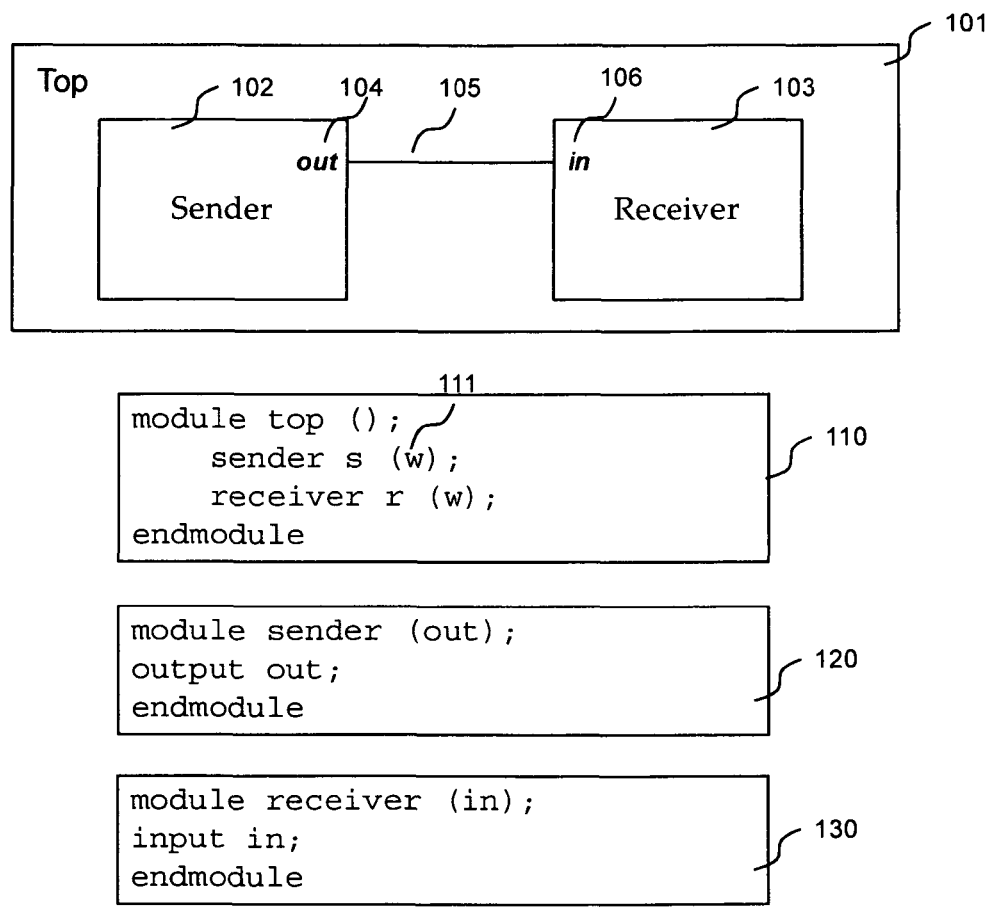

```
module sender (out);                                    ─201
output out;
initial begin
    $dgw_set (out, "frequency", 2.4e-9);
    $dgw_set (out, "out_high", 1.1);
    $dgw_set (out, "out_low", 0.5);
end
endmodule
```

```
module receiver (in);                                   ─210
input in;
always begin
    $display ("in=%e", $dgw_get(in, "frequency"));
    @(in);
end
endmodule
```

Fig. 2

```
module sender1 (out);
output out;
integer i;
initial begin
  $dgw_set (out, "value", 1.5);
end
endmodule
```
⎫ 401

```
module sender2 (out);
output out;
integer i;
initial begin
  $dgw_set (out, "value", 3.2);
411 ─ $dgw_drive_set (out, 0);
end
endmodule
```
⎫ 410

```
module sender (out);
output out;
initial begin
    $dgw_property_set ("^type", out, "main", "voltage");
    $dgw_set (out, "main", 2.5);
    $dgw_strength_set (out, "main", 100);
    #1;
    $display("V=%e, I=%e", $dgw_get_v(out, "main"),
        $dgw_get_i(out, "main"));
end
endmodule
```
602 — $dgw_property_set
603 — $dgw_set
604 — $dgw_strength_set
605
606 — $dgw_get_i

601

```
module receiver (in);
input in;
initial begin
    $dgw_property_set ("^type", in, "main", "current");
    $dgw_set (in, "main", 0);
    $dgw_strength_set (in, "main", 1.0/100.0);
    #1;
    $display("V=%e, I=%e", $dgw_get_v(in, "main"),
        $dgw_get_i(in, "main"));
end
endmodule
```
611 — $dgw_property_set
612 — $dgw_set
613 — $dgw_strength_set
614
615 — $dgw_get_i

610

Fig. 6

$$V = \frac{\sum_{i=1}^{n}(V_i/R_i) - \sum_{j=1}^{m} I_j}{\sum_{i=1}^{n}(1/R_i) - \sum_{j=1}^{m} G_j}$$

where n is the total number of voltage sources where m is the total number of current sources $$i = (v - V_i)/R_i$$

where i is the specific V source $$i = I_j + v*G_j$$

where j is the specific I source

| Math extension | Description |
|---|---|
| $dg_ln(x) | natural log of x |
| $dg_log10(x) | base 10 log of x |
| $dg_exp(x) | e^x |
| $dg_sqrt(x) | square root of x |
| $dg_pow(x,y) | x^y |
| $dg_ceil(x) | round to the ceiling of x |
| $dg_floor(x) | round to the floor of x |
| $dg_sin(x) | sine of x where x is in radians |
| $dg_cos(x) | cosine of x where x is in radians |
| $dg_tan(x) | tangent of x where x is in radians |
| $dg_asin(x) | arc sine of x |
| $dg_acos(x) | arc cosine of x |
| $dg_atan(x) | arc tangent of x |
| $dg_atan2(y, x) | arc tangent function of two variables where both variables are used to determine the quadrant |
| $dg_hypot(x1, x2) | square root of x * x + y * y |
| $dg_sinh(x) | hyperbolic sine of x |
| $dg_cosh(x) | hyperbolic cosine of x |
| $dg_tanh(x) | hyperbolic tangent of x |
| $dg_asinh(x) | inverse hyperbolic sine of x |
| $dg_acosh(x) | inverse hyperbolic cosine of x |
| $dg_atanh(x) | inverse hyperbolic tangent of x |
| $dg_abs(x) | absolute value of x |
| $dg_round(x) | rounded value of x |
| $dg_min(x1, x2, ...) | the minimum of any number of arguments passed to the function |
| $dg_max(x1, x2, ...) | the maximum of any number of arguments passed to the function |
| $dg_k | Boltzmann's constant |
| $dg_pi | The value of $\pi$ |
| $dg_2pi | The value of $2*\pi$ |
| $dg_rdist_uniform (seed, min, max) | Function to create a random numbers in a uniform distribution |
| $dg_rdist_normal (seed, mean, stddev) | Function to create a random numbers in a normal distribution |

Fig. 18

SOFTWARE EXTENSIONS TO A HIGH LEVEL DESCRIPTION LANGUAGE SIMULATOR TO PROVIDE INFRASTRUCTURE FOR ANALOG, MIXED-SIGNAL, RF MODELING AND VERIFICATION

CROSS-REFERENCE TO RELATED APPLICATIONS

This application claims the priority of U.S. Provisional Patent Application No. 61/231,281 filed on Aug. 4, 2009 by the present inventors, which is incorporated by reference herein.

FEDERALLY SPONSORED RESEARCH

Not Applicable

SEQUENCE LISTING OR PROGRAM

Not Applicable

FIELD OF INVENTION

This invention extends a high level description language so that single or multi-channeled real values, electrical signals, or a combination can be passed on model ports. It also adds other capabilities to facilitate analog, mixed-signal, RF modeling such as extending the language to provide math functions suitable for writing these models.

BACKGROUND

This invention extends a high level description language so that single or multi-channeled real values, electrical signals, or a combination may be passed on model ports. In this patent application, this capability is referred to as analog wires. The term, dgWires, is synonymous with analog wires. The invention also adds other capabilities to facilitate analog, mixed-signal, radio-frequency (RF) modeling such as extending the language to provide math functions suitable for writing these models. The invention will typically be used by an engineer to assist in the design of an electrical system such as an integrated circuit or system of integrated circuits and electrical components on a printed circuit board.

At the core of an analog, mixed-signal, or RF design are blocks or subcomponents of the design that communicate by transmitting information on wires from one block to another. Many languages are available for modeling and writing regression tests. The two languages most suited to modeling analog are Verilog-AMS and VHDL-AMS. Simulators that can handle these languages require both a digital event-driven simulation engine and an analog or circuit ordinary differential equation solver engine. The latter is generally known as a SPICE engine or analog simulator. A SPICE engine requires solving a network of simultaneous equations. Simulators that have both an event-driven simulation engine and SPICE engine or generally known as AMS simulators. There are two primary disadvantages when using an AMS simulator over only a pure digital event-driven simulator. The first disadvantage is simulation speed. A SPICE engine typically runs slower than a digital event-driven simulator. As a result, when simulating a design, the combination of the two simulators runs slower than the digital event-driven simulator. The second disadvantage is cost. Because both simulation technologies are required for an AMS simulator, vendors of simulators charge a premium for the AMS simulator. Because of these disadvantages, analog design and verification engineers have attempted to only apply digital event-driven simulators to model analog, mixed-signal, and RF designs. However, because the digital event-driven simulators were not intended to model analog designs, there are limitations to what may be done. Specifically, one of the most prevalent modeling languages for digital design is Verilog. A key stumbling block to Verilog is that continuous-valued signals, e.g. real numbers, cannot be passed from a design block (module) to another. U.S. Pat. No. 7,260,792 to Chandrashekar L. Chetput, Ramesh S. Mayiladuthurai, and Prasenjit Biswas (2007) and U.S. Pat. No. 7,251,795 to Prasenjit Biswas, Ramesh S. Mayiladuthurai, Chandrashekar L. Chetput, and Abhijeet Kolpekwar (2007) describe methods for passing signals in a mixed-language, mixed-signal design where both a digital event-driven simulation engine and a SPICE engine is required.

To work around this problem in Verilog, engineers have attempted to develop methods by which to pass real numbers between blocks. Initial attempts focused on staying within the Verilog language. They include converting a real number to a 64 bit bus using the $realtobits and $bitstoreal command. This has the disadvantage that it changes the interface of the block from 1 wire to 64 wires. This is usually unacceptable. Another method is to use out of module references to real variables inside the block. This has the disadvantage that one has to know the name of the sender block in order to be able to access the information that is being transmitted. The name of the block is usually not known by adjacent blocks and thus, this is also not workable as a solution. Another method is to convert the 64 bits into a serial stream of data transmitted across the port. This has the disadvantage in that it may slow down the simulation and there is coding overhead to set up the transmitters and receivers to code and decode the data. Similar to this is to use pulse width modulation techniques to indicate the value of the real variable. This again has a disadvantage of requiring a coder and decoder. None of these solutions have been satisfactory as designers and verification engineers sought other solutions. The next set of solutions look toward different languages. VHDL allows the passing of real variables between blocks. The disadvantage of using VHDL is that Verilog is a much more popular language. As a result, it is difficult to find engineers who have the knowledge to program in VHDL and companies are reluctant to convert all of their models to VHDL fearing that their models will be forever incompatible with the more popular Verilog language. Another choice is to use Verilog-AMS, but not write models in such a way that use the SPICE simulator but take advantage of a "wreal" port type which is a wire which carries a real value. This still has the cost disadvantage. The "wreal" port type also does not have all of the capabilities required for analog modeling. Finally, a newer language is SystemVerilog which allows for real valued ports. The disadvantage here is that it is a newer language, and so fewer engineers know how to use it, but more significantly, at present it is not compatible with either of the AMS languages as there are no AMS extensions to SystemVerilog. The significance of this limitation is apparent when it comes time to verify that an analog model, which is generally manually generated, matches the corresponding circuit. The model has to be validated by a regression test that may simulate and compare against the transistor level implementation. Thus, the language used by the regression test has to be compatible with the modeling language. The SystemVerilog also does not have all of the capabilities required for analog modeling.

Besides passing a single real value between one block to another, there are other capabilities required for analog modeling. These requirements include the need to pass more than one real number across a signal a wire. Another capability is the need to turn on and off the pin or port on the block to support analog buses. There is a need to show the state of the connecting wire, whether or not there is contention or whether or not there is a signal driving the wire. Finally, there is the need to represent some electrical sources, such as voltage and current sources. It is very common to need to sum current sources, or check voltage source values. Seeing the loading effects are also important. There are efficiency concerns in implementing any solution that provides this capability as simulation speed is one of the reasons for using a digital event-driven language. Finally, when adding this capability, they have to be added in such a way that they are compatible with the key commercial simulators that designers and verification engineers are using. Often, a company will use more than one. Thus, models that are created must work in all of them and behave the same. It may also be the case that these event-driven models need to be connected to a model written in Verilog-AMS. One feature of the Verilog-AMS language is that connect modules may be written to connect electrical signals from the Verilog-AMS languages to logic signals in Verilog. For these analog wires, a requirement is that real values may be connected to Verilog-AMS using a connect module, so that analog signals may pass from an event-driven model to an analog simulator.

To support analog modeling, other capabilities are required, the Verilog language is limited in the math function it provides. Extensions need to be provided for these, and any capability added to the language needs to include some debugging aids to help debug issues as the designers and verification engineers write the models.

Having exhausted all of the standard languages, an alternative is to extend the language to provide the capabilities required. In US Patent Application Publication 2002/0049576 by Steven J. Meyer (published 2002), a system is described to extend the capabilities of an event-driven simulator, however, an analog simulator is still required. "Functional Verification in the Presence of Linear Analog Circuits" by Thomas J. Sheffler presented at the Design and Verification Conference in 2008, and "Design of a Switch-Level Analog Model for Verilog" by Thomas J. Sheffler presented at the IEEE International Behavioral Modeling and Simulation Conference in 2008 also describe extensions to an event-driven simulator to facilitate analog modeling. These extensions also require that a simultaneous set of equations be solved. Finally, "Sending Analog Values Along Digital Wires" by Chris S Jones, Jeff McNeal, and Ross Segelken presented at the Design and Verification Conference in 2007 describes a Verilog extension to pass analog values between Verilog models, but in this solution, important capabilities such as the ability to indicate whether or not a port is driven are not provided.

ADVANTAGES

This invention gives the capabilities required to model analog, mixed-signal, and RF designs while simulating a design at the higher speeds and lower cost of an event-driven simulator when compared to an AMS simulator. This invention also eliminates the disadvantages when staying within the Verilog language while allowing the user to continue to use the more widely known Verilog language. Finally, additional user knowledge is typically required when using the SPICE simulator within the AMS simulator. Since the SPICE simulator is not present, this knowledge is not required, and thus, makes analog circuit modeling accessible to a greater number of engineers.

SUMMARY

In accordance with one embodiment this invention provides a method for simulating a design of specifying at least one real value on at least one port of a network in at least one model of a design, specifying whether the port is driven, resolving at least one unspecified value in at least one model, and utilizing an extension to an event-driven simulator to enable this capability. The ports may be configured to be electrical. The electrical ports may be either current or voltage sources. On any port, there may be a plurality of channels. Each channel can be individually configured to take a real number, to be a voltage source, or be a current source.

DRAWINGS

Figures

Figure 3:
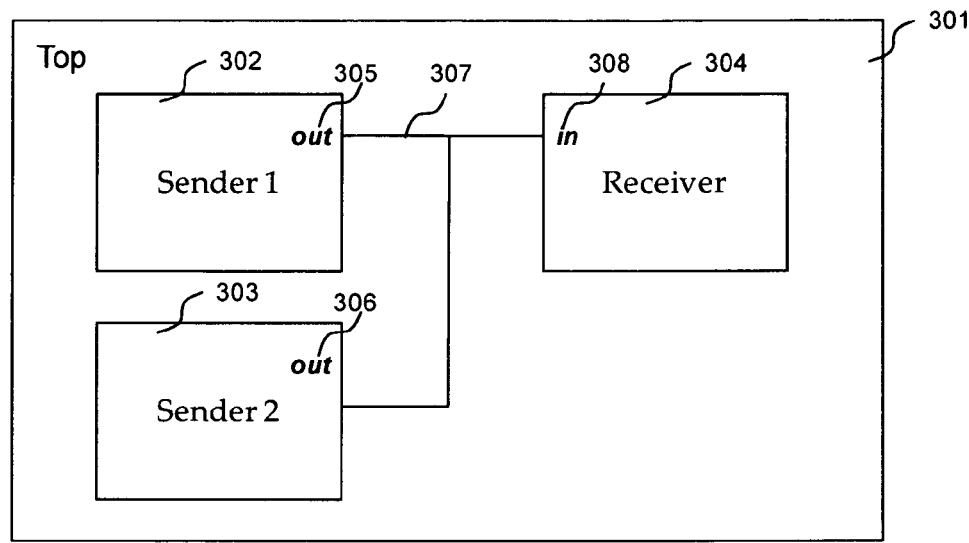
Figures 4, 5:
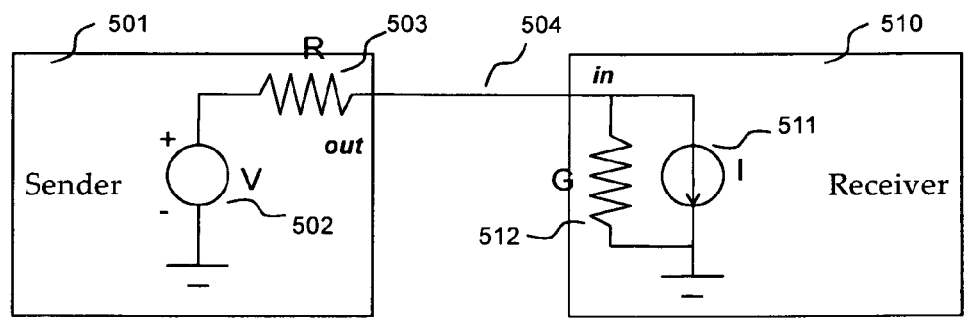
Figure 7:
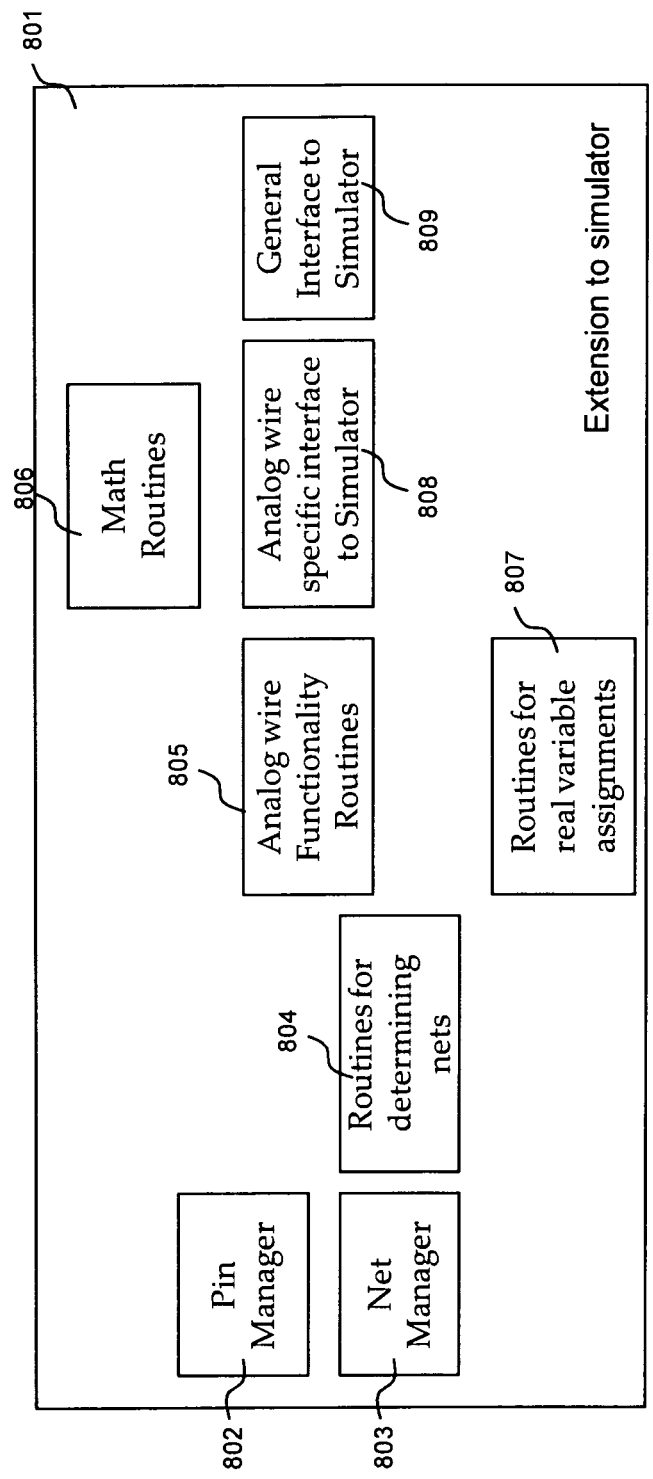
Figure 8:
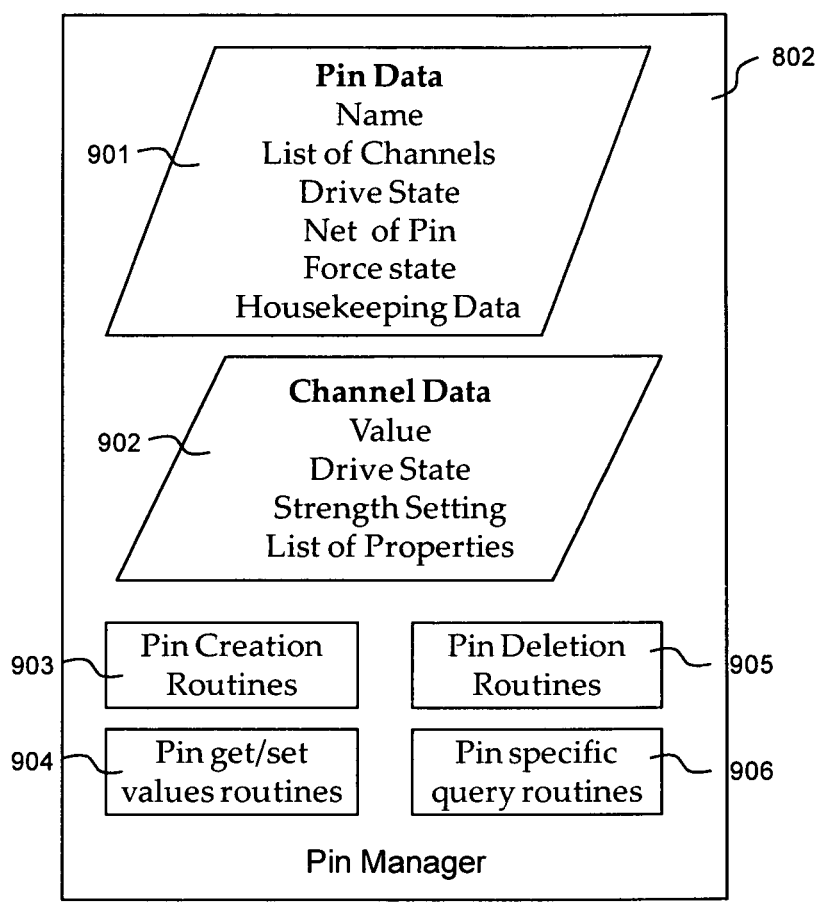
Figure 9:
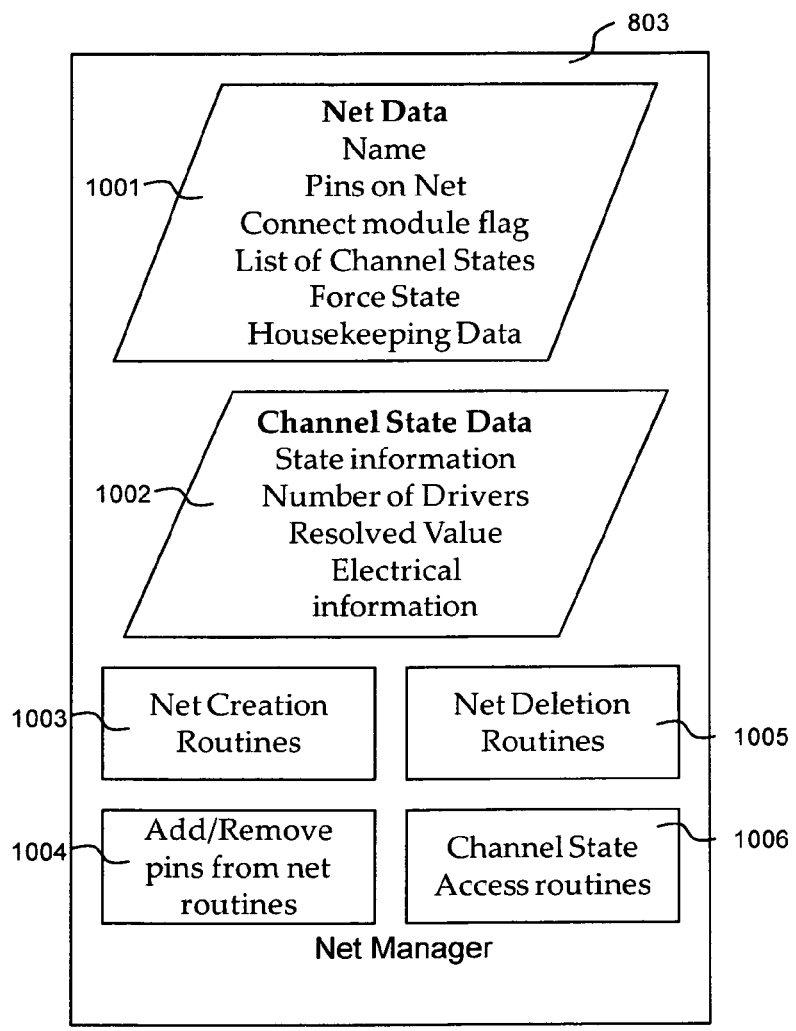
Figure 10:
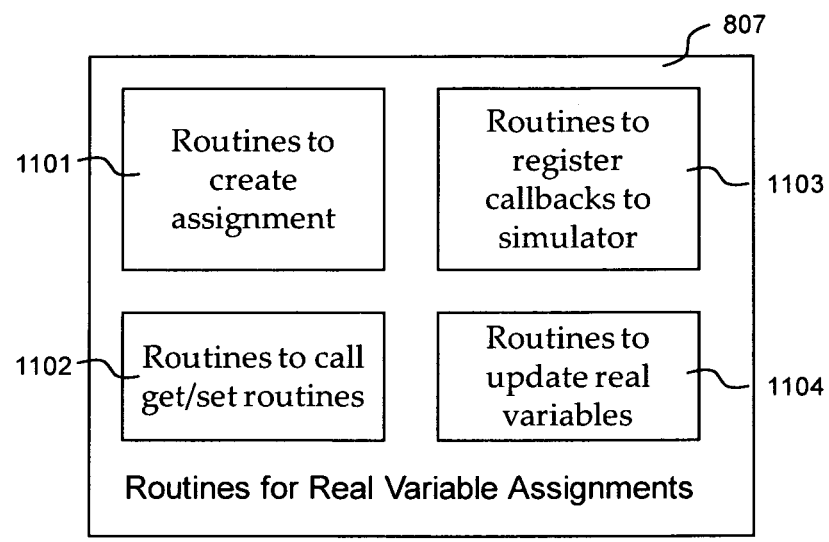
Figure 11:
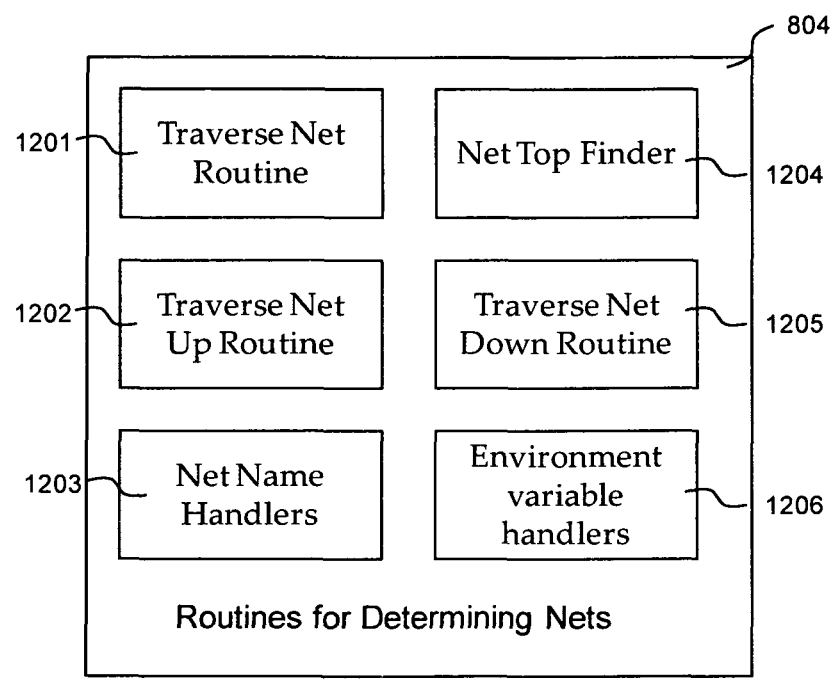
Figure 12:
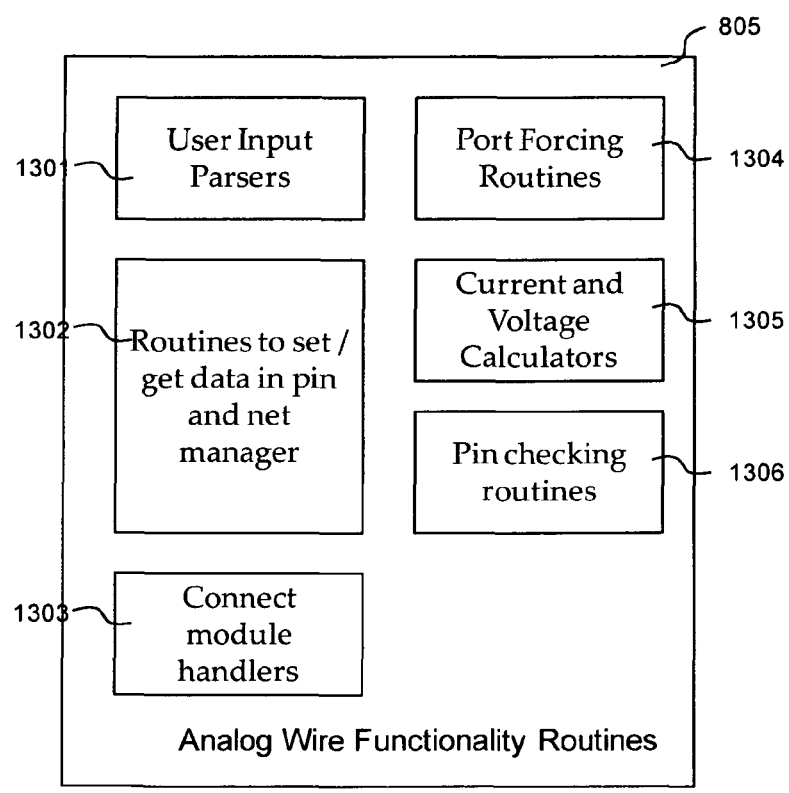
Figure 13:
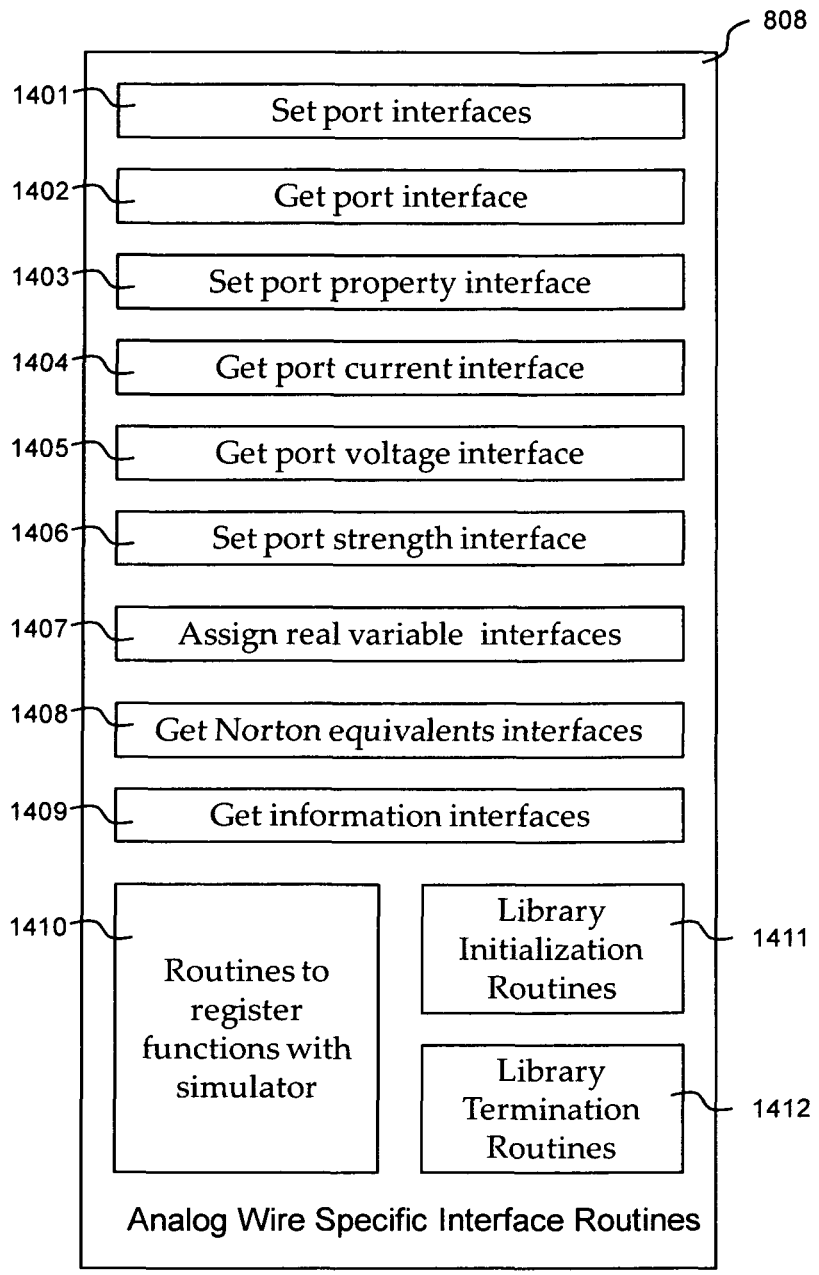
Figure 14:
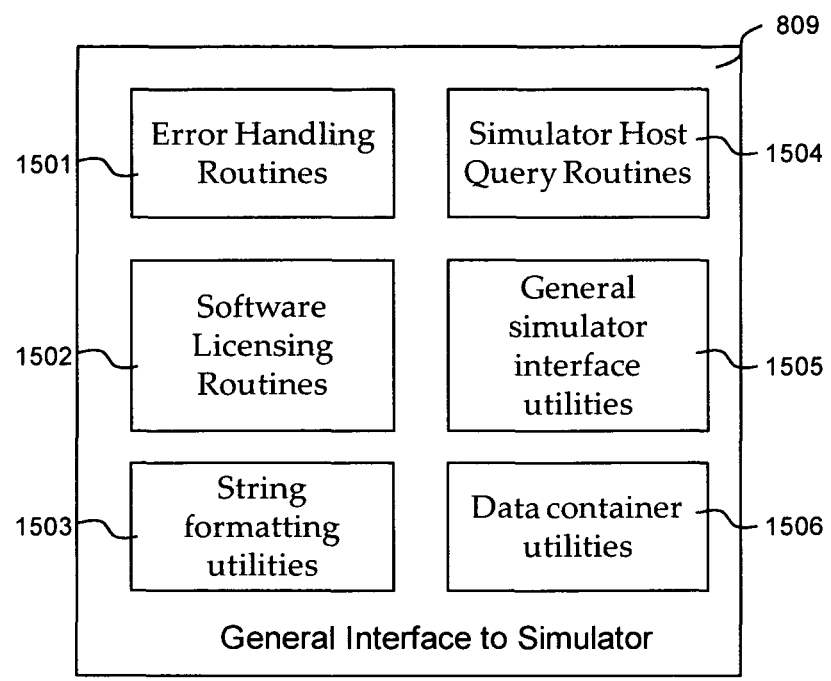
Figure 15:
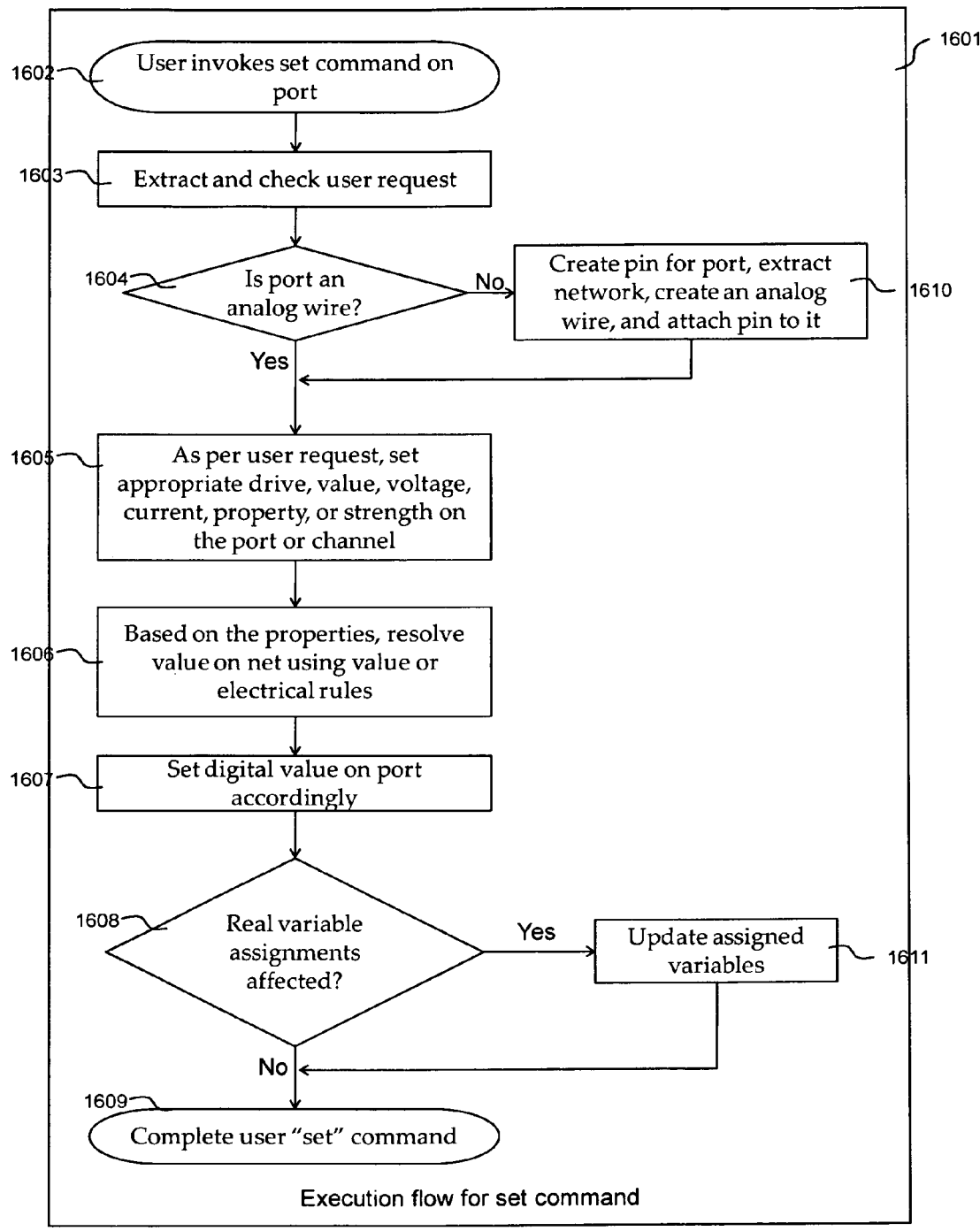
Figure 16:
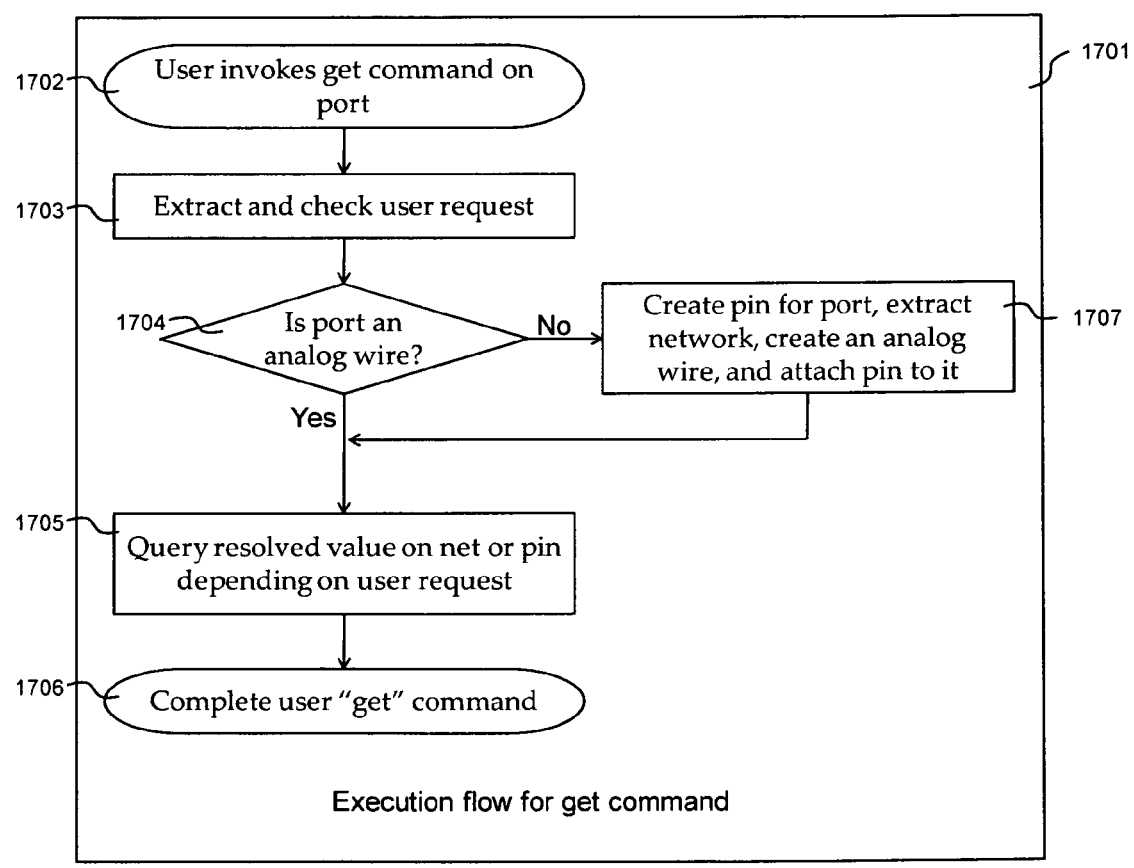
Figure 17:
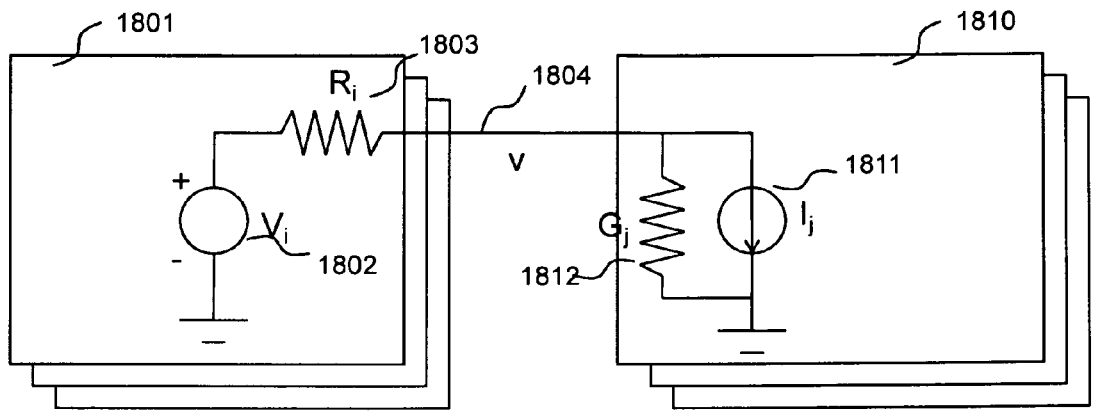
Figure 19:
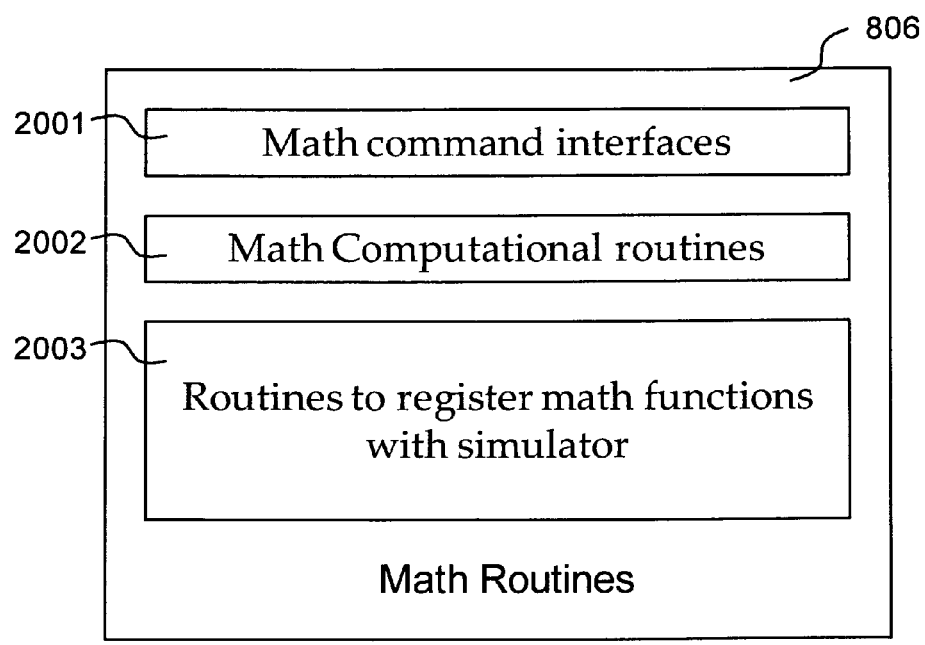

Embodiments of the invention will now be described in conjunction with the drawings, in which:

FIG. 1 is an example of a block sending information to another block on a wire, FIG. 2 is an example of sending and retrieving real values through the wire, FIG. 3 is an example of two blocks sending information on a bus, FIG. 4 is an example of sending real values on the bus, FIG. 5 is an example of two blocks on an electrical network, FIG. 6 is an example of configuring the two blocks on the electrical network, FIG. 8 are components of the extension to the simulator, FIG. 9 is a pin manager, FIG. 10 is a net manager, FIG. 11 are routines for real variable assignments, FIG. 12 are routines for determining nets, FIG. 13 are wire functionality routines, FIG. 14 is an analog wire specific interface routines, FIG. 15 is a general interface to simulator, FIG. 16 is an execution flow for set command, FIG. 17 is an execution flow for get command, FIG. 18 is an electrical wire implementation, FIG. 19 is a list of math extensions, and FIG. 20 are math routines.

REFERENCE NUMERALS

101—example block that contains two blocks
102—example block that sends data
103—example block that receives data
104—example output port
105—example wire
106—example input port
110—example Verilog description for block 101
111—example Verilog wire implementing wire 105
120—example Verilog description for block 102
130—example Verilog description for block 103
201—example code for sending real values
202—output port
203—analog wire set command
204—analog wire channel example
205—analog wire value example
210—example code for receiving real values 211—input port
212—analog wire get command
213—analog wire channel example
301—example block that contains 3 blocks
302—example block that sends data
303—another example block that sends data
304—example block that receives data
305—output port of block 302
306—output port of block 303
307—example wire acting as a bus
308—input port of block 304
310—example Verilog description of block 301
311—example Verilog wire describing wire 307
401—example Verilog description of block 302
410—example Verilog description of block 303
411—example use of the drive set command
501—example block with electrical output
502—voltage source for output
503—output resistance for output
504—example analog electrical wire
510—example block with electrical input
511—current source for input
512—conductance of current source
601—example Verilog description for block 501
602—example of command to set the analog wire to be a voltage source
603—example of setting a voltage value
604—example of setting the output resistance of the voltage source
605—example of getting the port voltage
606—example of getting the port current
610—example Verilog description for block 510
611—example of command to set the analog wire to be a current source
612—example of setting the current value on the current source
613—example of setting the conductance of the current source
614—example of getting the port voltage
615—example of getting the port current
801—extension to simulator
802—pin manager routines
803—net manager routines
804—routines for determining nets
805—analog wire functionality routines
806—math routines
807—routines for real variable assignment
808—analog wire specific interface to simulator
809—general interface to simulator
901—pin data
902—channel data
903—pin creation routines
904—pin get/set value routines
905—pin deletion routines
906—pin specific query routines
1001—net data
1002—channel state data
1003—net creation routine
1004—add/remove pins from net routines
1005—net deletion routines
1006—channel state access routines
1101—routines to create assignment
1102—routines to call get/set routines
1103—routines to register callbacks to simulator
1104—routines to update real variables
1201—traverse net routine
1202—traverse net up routine
1203—net name handlers
1204—net top finder
1205—traverse net down routine
1206—environment variable handlers
1301—user input parsers
1302—routines to set/get data in pin and net manager
1303—connect module handlers
1304—port forcing routines
1305—current and voltage calculators
1306—pin checking routines
1401—set port interfaces
1402—get port interfaces
1403—set port property interface
1404—get port current interface
1405—get port voltage interface
1406—set port strength interface
1407—assign real variable interfaces
1408—get Norton equivalents interfaces
1409—get information interfaces
1410—routines to register functions with simulator
1411—library initialization routines
1412—library termination routines
1501—error handling routines
1502—software licensing routines
1503—string formatting utilities
1504—simulator host query routines
1505—generator simulator interface utilities
1506—data container utilities
1601—execution flow for set command
1602—user invocation
1603—parse user request
1604—check to see if port is an analog wire
1605—execute user request
1606—resolve analog wire
1607—set digital value on port
1608—check for real variable assignments
1609—complete set command
1610—create analog wire
1611—updated assigned real variables
1701—execution flow for get command
1702—user invocation
1703—parse user request
1704—check to see if port is an analog wire
1705—execute user request
1706—complete get command
1707—create analog wire
1801—blocks containing voltage sources connected to a common wire and channel
1802—voltage source of a block
1803—output resistance of a block
1804—common wire and channel
1810—blocks containing current sources connected to a common wire and channel
1811—current source of a block
1812—conductance for current source of a block
1820—equation to calculate port voltages of the port connected to the common wire and channel for the blocks
1821—equation to calculate the port current of the port connected to the common wire and channel of a block with a voltage source
1822—equation to calculate the port current of the port connected to the common wire and channel of a block with a current source
1901—math extensions
1902—description of math extensions
2001—math command interfaces
2002—math computational routines
2003—routines to register math functions with simulator

DETAILED DESCRIPTION

First Embodiment

The software extensions to a high level description language simulator to provide the infrastructure for analog, mixed-signal, RF modeling, and verification are implemented by extending an event-driven simulator. The components of one embodiment that make up this extension 801 is shown in FIG. 8. The components are pin manager routines 802, net manager routines 803, routines for determining nets 804, routines to provide the analog wire functionality 805, general math routines 806, routines for real variable assignments 807, analog wire specific interface to the simulator 808, and the general interface to the simulator 809. In this embodiment, the extension is in the form of a library that is linked into a simulator at run time utilizing the VPI and PLI 1.0 application programming interfaces to a Verilog simulator.

The pin manager 802 shown in FIG. 9 manages all pin specific information. The pin manager 802 has data specific to the pin 901, data specific to each of the channels 902, pin creation routines 903, pin deletion routines 905, routines to set and get the value of pins and channels 904, and routines to query information about the pins and channels 906. The pin data 901 includes the name of the pin, the list of channels on the pin, the drive state of the pin, the net to which the pin is attached, to what the digital port has been forced, and some housekeeping data. The drive state refers to whether or not the pin is driving or not. The force state may be a binary value of "1", "0", "X", or "Z". The channel data 902 includes the value to which that pin and channel are set, the drive state for that particular channel, the drive strength of the channel, and a list of properties associated with that channel. The value of the pin and channel include a numeric value, a voltage value and an electrical current value. The numeric value may be an integer, real number, or equivalent representation that can be translated into an integer or real number. The drive state includes whether or not the channel is off or on. The strength setting includes a value of resistance for a voltage source and a conductance for a current source. The list of properties includes the channel type. The available channel types includes driving a numeric value, modeling a voltage source, and modeling a current source.

The net manager 803 shown in FIG. 10 manages all net specific information. The net manager 803 has data specific to the net 1001, state data specific to the channel on the net 1002, net creation routines 1003, net deletion routines 1005, routines to add and remove pins from a net 1004, and routines to access the channel state 1006. The net data 1001 includes the name of the net, a list of pins on the net, a flag indicating whether or not the net is associated with a port on a connect module, a list of channel states, to what the digital net has been forced, and some housekeeping data. The channel state data 1002 includes specific state information for that channel, information on the number of drivers driving the channel, the resolved value of the channel, and electrical information. The state information includes topological data on the net such as whether or not all of the pins on the net are electrical, and whether or not the net is under contention. The resolved value may include being a numeric value or a voltage. The electrical information may include the number of ideal voltage sources on the net, the number of ideal current sources on the net, the total conductance on the net, the sum of the voltages sources divided by resistance, the sum of the current sources, and the sum of the Thevinin equivalent current sources.

The routines for real variable assignments 807 shown in FIG. 11 handle the situation where the user of the library wants to assign a real variable to track one of the values that may be set or get on the analog wire. These routines for real variable assignments 807 include routines to create the assignment 1101, routines to call the get and set routines 1102 found in the analog functionality routines 805, routines to register callbacks to the simulator 1103, and routines to update the real variables tracking the values 1104.

The routines for determining the nets 804 shown in FIG. 12 are used to discern what the complete net of the ports given a port on that net. The main routine is the traverse net routine 1201. Components used by the traverse net routine 1201 include the traverse net up routine 1202, the traverse net down routines 1205, the net top finder 1204, and the net name handlers 1203. A utility routine found within the routines for determining nets 804 is the environment variable handlers 1206. The environment variable handlers allow the user to this extension to specify different options when handling net traversal and certain behavior of the analog wires.

The main analog wire functionality routines 805 shown in FIG. 13 handle the core functionality of the analog wires. These routines include user input parsers 1301, routines to set and get data in the pin and net managers 1302, connect module handlers 1303, port forcing routines 1304, current and voltage calculators 1305, and pin checking routines 1306.

The analog wire specific interface routines 808 shown in FIG. 14, handle analog specific commands from the extensions within the high level description language written by the user, and interfaces to the event-driven simulator. The user interfaces include the interface to set port and channel values 1401, the interface to get port and channel values 1402, the interface to set properties on a port and channel 1403, the interface to get a port and channel current 1404, the interface to get a port and channel voltage 1405, the interface to set the strength of a port and channel 1406, the ability to assign real variables to a particular analog wire value 1407, the interfaces to get a Norton equivalent of the network connected to a port and channel 1408, and interfaces to get diagnostic information about the analog wires 1409. The simulator interfaces include routines to register the user functions or commands with the simulator 1410, routines to initialize the extension to the simulator 1411, and routines to terminate the extension to the simulator 1412.

Finally, there are general interface routines to the simulator 809 shown in FIG. 15. These include error handling routines 1501, software licensing routines 1502, string formatting utilities 1503, simulator host query routines 1504, general simulator interface utilities 1505, and data container utilities 1506. The simulator host query routines 1504 include routines to determine the name of the event-driven simulator. The general simulator interface utilities 1505 contain general purpose routines that may be used in applications beyond handling analog wires. Included in the data container utilities are access routines to lists and hash tables.

The math commands also have a set of math specific interface routines 806. They comprise of a set of math command interfaces 2001, a set of math computational routines 2002, and routines to register the math commands or functions with the simulator 2003.

Finally, simulator specific code has be implemented in various components of the extension 801 so that the user employing the library sees a result that is as simulator independent as possible.

Operation

FIG. 1 shows an example of a design or block 101, which contains two blocks. The intention of the engineer in this example is that the first block 102 sends data to the second block, the receiver 103. The sender block 102 has an output port called out 104. The receiver block has an input port, in 106. The information is to be sent along a wire 105. To model this system, an engineer writes code to describe this system. An example description is shown in FIG. 1 in Verilog. Verilog is one of many high level description languages. The example design 101 represented by the code in the module description of top 110. The sender block 102 is represented by the code in the module description of sender 120. The receiver block 103 is represented by the code in module description of receiver 130. The wire is represented by the wire, w 111. In this example, a limitation of the Verilog language is that real numbers cannot be sent across the wire. The engineer is limited to sending binary digital data. Binary data is insufficient to model analog, mixed-signal, and RF systems and integrated circuit designs since the very nature of analog, mixed-signal, and RF is to send continuous valued signals along wires. A key advantage of this invention is to enable the modeling of analog, mixed-signal, and RF systems and integrated circuit designs. This modeling may be used in the design phase and in the verification phase.

To enable the analog wire capability, we extend the language with new commands. The first set of commands is to enable the ability to send single or multi-channeled real values in a point-to-point fashion or on an analog bus. The ability to send multi-channeled real values is necessary when doing a style of modeling known as baseband equivalent modeling or phase domain modeling. In this style, multiple pieces of information need to be sent on a single wire simultaneously. Each piece of information is sent along a channel. With the analog wires, there may be any number of channels on a wire.

In this implementation for the analog wires, the language is extended with commands that begin with "$dgw." These first set of commands are the $dgw_set, $dgw_get, and $dgw_drive_set commands. The $dgw_set command sets a value onto a wire. The value is an input into the $dgw_set command. The $dgw_get command retrieves the resolved value on that wire. The $dgw_drive_set command sets a port to on or off to support an analog bus. Whether the port is on or off is an input to the $dgw_drive_set command.

The $dgw_set commands takes three arguments—a port on the module, a name for the channel, and the value to be set on that channel. The port may be an input, output, or bidirectional.

The channel may be any name that the engineer chooses. The value may be an integer, real number, or equivalent representation that can be translated into an integer or real number. The sender module 201 in FIG. 2 shows an example of how to use the $dgw_set command. In this example, the output port is called out 202. Three uses of the $dgw_set command 203 show how three different channel names 204 are used—"frequency", "out_high", and "out_low". Each of these port 202 and channel 204 combinations are set to different values 205. The channels used are often application dependent. In RF, typical other channels include "phase" and "amplitude."

To receive a signal, an engineer would use the $dgw_get command. The $dgw_get command takes two arguments—the name of the port and the name of the channel that is to be accessed. FIG. 2 shows the module receiver example 210 of how the engineer might use the $dgw_get command. In this example, the input port is called in 211. The $dgw_get command is used in a $display statement 212 which receives the value on the wire connected to in 211 and on channel "frequency" 213. To determine when the value on the port and channel have been changed, the in port 211 is monitored for changes. The $dgw_set command when executed changes the value on the four valued binary wire to indicate that a change was made. For example, in the block configuration 101, the out port 104 binary value is changed. This change is propagated on wire 105, and is received on the input port, in 106. This change is seen by the model representation of in 211, and the module 210 will react accordingly.

Another common configuration of blocks is where the wire connecting blocks acts as an analog bus. This is shown FIG. 3. In this block topology 301, there are two sending blocks—sender one 302 and sender two 303. Sender one has an output port, out 305. Sender two also has an output port, out 306. In this example, there is one receiver 304 which has one input port, in 308. The two output ports and input port are connected by a wire 307. A Verilog representation of this topology 310 shows the wire 311 which connects the three blocks.

There are four possible configurations for the driving blocks—both blocks could be driving values, neither block could be driving values, only block one could be driving, or only block two could be driving. To enable all four configurations, the $dgw_drive_set command is provided. The $dgw_drive_set command takes two arguments, the name of the port, and a value of 1 or 0 to indicate on and off respectively. An example of using the $dgw_drive_set command is shown in FIG. 4. A description of sender one 401 and sender two 410 are shown. In this situation, the example shows how sender one may be configured to send while sender two is configured not to send. The $dgw_drive_set command example 411 shows how the port out for module 410 is set to 0, indicating that the out port of module 410 is not to drive the wire, w 311. The four valued binary number of the wire representing the bus provides an indication of the configuration. In the general case where there are many driving blocks on the wire, if more than one wire is driving, a binary "x" value is placed on the wire to indicate that there is contention on the bus. If no blocks are driving, a binary "z" value is placed on the wire to indicate that the bus is undriven. If a "0" or "1" is placed on the wire, this indicates normal operation or that only one block is driving the wire. As the analog wire value changes in normal operation, the "0" and "1" values are toggled to "1" and "0" respectively.

Besides passing a value along a wire, it is often necessary that an analog wire have electrical characteristics. This is shown in FIG. 5. Again, this is an example where there is one sender 501 connected to one receiver 510 by a wire 504. In this example, the sender 501 has a voltage source 502 and an output resistance 503 in series with the voltage source connected to the output port. The receiver 510 has a current source 511 and conductance 512 in parallel to the current source on the input. In general, regardless of port direction, the module may have either a voltage source or a current source. The resistance and conductance may take on any value including zero, positive and negative numbers. The voltage and current source may also take on any value include zero, positive, and negative numbers. As with passing real values, there may be any number of electrical channels on a port. The ports may also be turned on and off using the $dgw_drive_set command. Any number of voltage and current sources may be placed on a port and channel.

To allow this functionality, a $dgw_property_set, $dgw_strength_set, $dgw_get_v, and $dgw_get_i, are added in addition to the previous extensions described. When a port and channel is configured to be driven by a voltage or current source, the value on the $dgw_set command indicates the voltage and current respectively. The value may be an integer, real number, or equivalent representation that can be translated into an integer or real number. The $dgw_property_set command is used to indicate whether or not the port and channel is driven by a voltage source, current source, or to pass by numeric value. The $dgw_strength_set command is used to set the value of the resistance or conductance of a voltage or current source respectively. The $dgw_get_v command is used to get the port voltage. The $dgw_get_i command is used to get the port current.

FIG. 6 shows an example of configuring an electrical network. A sender module example 601 sets up a 2.5 volt voltage source with a source resistance of 100 ohms. The $dgw_property_set command takes four arguments—what property is to be changed, the port and channel that is to be changed, and a value for that property. The $dgw_property_set command example 602 shows how the type of the port, out, and channel, "main," is being changed to a voltage. The $dgw_set example 603 shows how the voltage is being set to 2.5. The $dgw_strength_set command takes 3 arguments, the port and channel, and the value for the resistance or conductance for the voltage or current source respectively. The $dgw_strength_set example 604 shows how to set the example output resistance of the current source to 100 ohms. The $dgw_get_v and $dgw_get_i command both take two arguments—a port and the name of the channel. The $dgw_get_v example 605 shows how to retrieve the port and channel voltage for out and "main". The $dgw_get_i example 606 shows how to retrieve the port and channel current for out and "main".

A receiver module example 610 sets up a 0 amp current source with an output conductance of 0.01 mhos, or 100 ohms in terms of resistance. The $dgw_property_set example 611 sets the port, in, and channel, "main," to be a current. The value of the current source is set to 0 with the $dgw_set example 612. The conductance is set to 0.01 in the $dgw_strength_set example 613. The port voltage and port current is retrieved in the $dgw_get_v example 614 and $dgw_get_i example 615 respectively.

In addition to these extensions, a set of convenience commands are added for assigning real variables to many of the values that may be set or get. The commands are $dgw_assign, $dgw_assign_strength, $dgw_assign_i, and $dgw_assign_v. $dgw_assign takes 3 arguments—a port, a channel, and a real variable. This command assigns the value on that port and channel to the real variable specified, so that if the value of the port and channel changes, the real variable will also change. It is also the case that if the real variable is changed, the value on the port and channel will also change. The real variable may be the value on the port and channel, or the voltage of a voltage source or the current of a current source. The $dgw_assign_strength command takes three arguments—a port, a channel, and a real variable. In this case the real variable is tied to the resistance or conductance value of the voltage or current source respectively on that port and channel. If the resistance or conductance value changes, the real variable will also change. If the real variable is changed, the resistance or conductance value will be changed. The $dgw_assign_i and $dgw_assign_v commands take three arguments as well—a port, a channel, and a real variable. In this case, for $dgw_assign_i, the real variable changes to the value of the port current as the port current changes and for $dgw_assign_v, the real variable changes to the value of the port voltage as the port voltage changes.

Another set of extensions aid in determining the equivalent circuit to which a port is connected. For example, suppose there is an electrical network on a wire. On a particular port, the engineer is interested in understanding what the equivalent circuit is connected to that port, that is, the electrical network external to the port on a particular block. Three commands extend the high-level description language to aid in this effort—$dgw_ext_norton_exists, $dgw_ext_norton_i, and $dgw_ext_norton_g. The $dgw_ext_norton_exists command takes two arguments—a port and channel, and returns whether or not a Norton equivalent exists for the connecting network. If the network is comprised of voltage and current sources, a situation where the Norton equivalent will not exist is if there are only ideal voltage sources on the network. If it is a valid network, then to get the value of the voltage source, the engineer may use the $dgw_get_v command. Where there is a Norton equivalent, to get the current for the Norton equivalent, the engineer uses the $dgw_ext_norton_i command which takes two arguments, the port and channel. To get the Norton equivalent conductance the engineer uses the $dgw_ext_norton_g command which takes two arguments—the port and channel. There are a variety of situations where these extensions may be used—the most common being in the writing of a connect module between an event-driven and circuit simulator where the equivalent circuit of a port needs to be created for the circuit simulator.

Finally, the extensions include a command to determine whether or not a port is being driven. This command is called $dgw_driven and takes a port as an argument. It turns a 1 if it is being driven by an analog wire, and a 0 if it is not. The $dgw_display_info command takes one or two arguments—either just a port, or a port and channel. Upon execution, it will display information related to that port or that port and channel. For example, it will list the network for the port. It will also list the resolved values on the port and channel combinations. The $dgw_display_info is mostly useful for debugging purposes.

In addition to the analog wire commands, a set of math command extensions have also been added. These extensions begin with "$dg" and are listed in FIG. 19 in the math extensions column 1901. Each has a description in column 1902.

To use the extension, once the models have been written with any of the extension commands, the engineer needs to tell the simulator to include the library extension 801. The engineer may use any number of simulators including the event-driven simulators provided by Cadence Design Systems, Inc., Mentor Graphics Corp., and Synopsys, Inc. Each has its own way of linking in library extensions and the engineer should follow the instructions provided with the simulator. In general, the name of the library needs to be provided by the name of the registration function in the library initialization routines 1411.

As long as the commands have been entered correctly, the engineer need not do anything else in using the library extension. With the specification of library extension in place, the library initialization routines 1411 are automatically called by the simulator. This calls the routines to register all of the extension functions to the simulator 1410. When a command in the library extension is encountered by the simulator, the appropriate interface in the analog wire specific interface routines 808 is called. For example, if the $dgw_set command is invoked, the set port interfaces 1401 is called. The execution flow for the set commands 1601 is shown in FIG. 16. The flow begins with the user invoking the command on the port 1603. The interface 1401 extracts and checks to see if the command is valid using the user input parsers 1301. If it is not, an error message is returned to the user. If it is, a check 1604 is made to see if the port is an analog wire using the pin checking routines 1306 and the routines to set and get data in pin and net manager 1302. If it is not, an analog port is created and attached to the network 1610. This is done using the routines found in the analog wire functionality routines 805. The command request is then executed to set the appropriate drive, value, voltage, current, property, or the strength on the port or channel 1605. In the case of the $dgw_set command, the value, voltage, or current is set. Based on the properties, the value of the wire is resolved using the value or electrical rules 1606. The value of the digital port is set to the one of four binary values 1607 using the port forcing routines 1304. A check is then made to see if any of the real variable assignments are affected 1608. If so, the real variables are updated 1611 using the routines in the real variable assignments 807. Upon the completion of the flow 1609, control is returned to the simulator execute other commands.

The execution flow for a get command 1701 is shown in FIG. 17. The execution flow begins 1702 with the invocation one of the get commands. The command is extracted and checked 1703. A check is made to see if the port is an analog wire 1704. If not, an analog wire is created 1707. If it is, a query on the resolved value of the net or pin is returned depending on the command request, 1705. The command is then completed 1706 and control is returned to the simulator.

FIG. 18 describes how the electrical values are computed. There may be any number of voltage sources 1801 on a wire 1804. There may also be any number of current sources 1810 on that wire 1804. Each of the voltage sources may have a different voltage specified by Vi 1802 where i is one of the voltage sources. Each of the voltage sources may also have a different resistance in series specified by Ri 1803 where i is one of the voltage sources. Each of the current sources may have a different current specified by Ij 1811 where j is one of the current sources. Each of the current sources may have a different conductance in parallel specified by Gj 1812 where j is one of the current sources. The total number of voltages sources is n and the total number of current sources is m. Where there is no value of resistance that is 0, the resolved value of the voltage on the wire is computed using the formula 1820. The resolved value of the port current of a voltage source is computed using formula 1821. The resolved value of the port current of a current source is computed using formula 1822. Where there is a value of resistance that is 0, if there is only 1, the resolved value of the voltage on the wire is the voltage associated with the voltage source that has a resistance of 0. If there is more than one voltage source with a resistance of 0, this is considered an invalid condition and the wire is placed in contention and driven with an "x" on the digital wire. As shown in formula 1820 and in formula 1821, the voltages and port currents can be computed without the need to solve a set of simultaneous equations. Also, since all of the information required to solve formula 1820 and formula 1821 in a single simulator time point, the voltages and port currents can be computed in a single simulator time point.

At simulation startup the routines to register the math functions with the simulator are called 2003. As the simulation proceeds, the math commands are handled though the math command interface 2001. Upon receiving the math command, the appropriate computational routine 2002 is called.

Alternative Embodiments

There are alternative embodiments to this invention. For example, the extension to the simulator need not be in a library linked to the simulator. This invention may be implemented as part of the simulator and not an extension. There are also many interfaces to an event-driven simulator. Any of these interfaces may be used. These include PLI 1.0, VPI, and proprietary interfaces specific to a particular simulator.

The method by which the software is organized need not be the same. For example, the routines 801 need not be subdivided as shown in FIG. 8. They may be all put into one set of routines or split in any manner. This is also true for the pin manager 802, the net manager 803, the routines for real variable assignments 807, the routines for determining nets 804, the analog wire functionality routines 805, the math routines 806, the analog wire specific interface routines 808, and the general interface to the simulator 809.

The embodiment described was written in the "c" and "c++" languages and extends the Verilog, SystemVerilog, and Verilog-AMS high-level description languages. An alternative embodiment is to implement using a different programming language, including such languages as just "c", just "c++", Tcl, Python, Ruby, Perl, or any combination. There are also any number of ways the code may be written to implement the same results. This include the ordering of flow 1601 and flow 1701. Another embodiment is to extend a different high-level description language. This include VHDL and VHDL-AMS.

Both the analog wire command and the math commands need not use the command names beginning with $dgw and $dg as described. For example, any of the commands, such as $dgw_set, may be changed to another name. Also, the number of arguments may be varied. For example, if there is only one channel on a port, the channel name need not be specified. The order of the arguments may also be changed.

A value that is passed to the set commands are described as an integer, real number, or equivalent representation that can be translated into an integer or real number. This value may also be a string. This is especially helpful if additional information is to be sent along a wire such as "current source of 10 uA with an accuracy of 1%". The entire string may be passed to convey the information from one block to another.

A library extension need not contain all of the commands provided here. A subset may be adequate for certain applications. The library extension may also contain additional commands to add additional functionality that might be required.

The examples provided in this patent application are for illustrative purposes. The intention of this invention is that this library extension may be used for very complex designs. There will be many blocks in the analog, mixed-signal, and RF section of the design. Each of these blocks may have one or more analog wire. The analog wires may contain any number of analog channels. Further many blocks may be connected to the same wire. This invention places no restriction on the number of blocks in a design, the number of analog wires in a block, the number of channels on a wire, the number of ports of blocks connected to a wire or net.

The user of this invention also need not be restricted to an engineer.

Finally, different terminology may be used. For example, "channels" may be called "signals".

CONCLUSION, RAMIFICATIONS, AND SCOPE

Thus the reader will see that at least one embodiment of this invention can extend an event-driven simulator to facilitate analog modeling without the need for an analog simulator. While the above description contains many specificities, these should not be construed as limitations on the scope, but rather as an exemplification of one preferred and alternative embodiments thereof. Many other variations are possible. Accordingly, the scope should be determined not by the embodiments illustrated, but by the appended claims and their legal equivalents.

The invention claimed is:

1. A method of simulating a design utilizing an extension to an event-driven simulator that adds capabilities, comprising:
   utilizing said event-driven simulator;
   taking as input a real number on at least one port of a network in at least one model;
   taking as input whether said port is driven;
   resolving at least one value on at least one port on said network; and
   utilizing at least one said value in at least one said model.

2. The method of claim 1, further comprising:
   forcing "z" on a wire on said network if all ports on said network are undriven; and
   forcing "x" on said wire if at least one said value on at least one port on said network cannot be resolved.

3. A method of simulating a design, comprising:
   utilizing an event-driven simulator;
   configuring at least one port of a network in at least one model as electrical;
   taking as input a real number on said port;
   resolving without utilizing a plurality of simultaneous equations at least one value on at least one port on said network; and
   utilizing at least one said value in at least one said model.

4. The method of claim 3 wherein said configured port is also configured to be driven by a voltage source, and said real number is a voltage.

5. The method of claim 4 wherein said value is a voltage.

6. The method of claim 4 wherein said value is a current.

7. The method of claim 4, further comprising:
   taking as input a drive strength on at least one said port, wherein said drive strength is a resistance in series with said voltage source.

8. The method of claim 3 wherein said configured port is also configured to be driven by a current source, and said real number is a current.

9. The method of claim 8, further comprising:
   taking as input a drive strength on at least one said port, wherein said drive strength is a conductance in parallel with said current source.

10. The method of claim 3, further comprising:
    utilizing an extension to said event-driven simulator.

11. The method of claim 3, further comprising:
    forcing "x" on a wire on said network if a voltage and a current cannot be resolved.

12. A method of simulating a design, comprising:
    utilizing an event-driven simulator;
    configuring a plurality of channels on at least one port of a network in at least one model;
    taking as input a real number on at least one said plurality of channels;
    resolving a plurality of values on at least one port on said network; and
    utilizing at least one said plurality of values in at least one said model.

13. The method of claim 12, further comprising:
    utilizing a software extension to said event-driven simulator.

14. The method of claim 12, further comprising:
    forcing "z" on a wire on said network if all ports on said network are undriven; and
    forcing "x" on said wire if at least one said plurality of values cannot be resolved.

15. The method of claim 12, further comprising:
    configuring at least one said plurality of channels as an electrical channel.

16. The method of claim 15 wherein at least one said electrical channel is also configured to be driven by a voltage source.

17. The method of claim 16, further comprising:
    taking as input at least one drive strength on said electrical channel wherein said drive strength is a resistance in series with said voltage source.

18. The method of claim 15 wherein at least one said electrical channel is also configured to be driven by a current source.

19. The method of claim 18, further comprising:
    taking as input at least one drive strength on said electrical channel wherein said drive strength is a resistance in parallel with said current source.

20. The method of claim 15, further comprising:
    forcing "x" on a wire on said electrical channel if a voltage and a current cannot be resolved.

* * * * *